(12) United States Patent
Dotan

(10) Patent No.: US 6,194,718 B1
(45) Date of Patent: Feb. 27, 2001

(54) METHOD FOR REDUCING ALIASING EFFECTS IN SCANNING BEAM MICROSCOPY

(75) Inventor: Noam Dotan, Givaetain (IL)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/158,826

(22) Filed: Sep. 23, 1998

(51) Int. Cl.$^7$ ................................................. G01N 23/00
(52) U.S. Cl. ................................................. 250/310; 250/307
(58) Field of Search ................................. 250/307, 310, 250/311

(56) References Cited

U.S. PATENT DOCUMENTS

| | | | |
|---|---|---|---|
| 4,811,409 | 3/1989 | Cavan | 382/8 |
| 4,907,287 * | 3/1990 | Homma et al. | 250/396 R |
| 5,299,308 * | 3/1994 | Suzuki et al. | 395/162 |
| 5,555,360 * | 9/1996 | Kumazaki et al. | 395/143 |
| 5,665,968 * | 9/1997 | Meisburger et al. | 250/310 |
| 5,925,875 * | 7/1999 | Frey | 250/208.1 |

OTHER PUBLICATIONS

Esikahu, Oho et al; Scanning, vol. 19, 483–488 (1997); "Electron Microscope Technology Based on the Concept of Active Image Processing".

* cited by examiner

*Primary Examiner*—Bruce C. Anderson
(74) *Attorney, Agent, or Firm*—Sughrue Mion Zinn Macpeak & Seas

(57) ABSTRACT

A method for reducing aliasing effects in scanning beam microscopy, comprises generating a plurality of successive images of the same object, wherein each image is shifted in the vertical direction with respect to the preceding one by a sub-pixel distance and then averaging all the images together.

17 Claims, 6 Drawing Sheets

METHOD FOR REDUCING ALIASING EFFECTS IN SCANNING BEAM MICROSCOPY

FIELD OF THE INVENTION

The present invention relates to a method for improving the quality of images obtained from scanning beam microscopy. More particularly, the invention relates to a method for reducing aliasing effects in scanning beam microscopy.

BACKGROUND OF THE INVENTION

When designing a beam scanning microscope, there is a trade-off between various operational parameters. A particularly important relationship is that between the size of the beam spot used to scan the surface, and the resolution of the microscope: the smaller the beam spot size, the higher is the resolution. Since the resolution is one of the most important features of a microscope, all systems are designed to have smallest possible beam spot size. Usually a small beam spot size is maintained even with large field of view.

When a two dimensional image of secondary electrons (SE) or back-scattered electrons (BSE) is produced, the pixel dimensions should be smaller than the spot size in order to reconstruct the information properly (Nyquist sampling theorem). If an improper ratio between the pixel size and the spot size is employed, and the information contains high frequency components, the information will be undersampled and aliasing effects will be generated. Aliasing errors, which are well known in the art, are exemplified in FIG. 1A, which is a scanning electron microscope (SEM) image of a photoresist on a silicon wafer. The aliasing errors are especially obvious at the fringes of the dark squares in the image, which are unequal in their intensity (Moire fringes). As a result, the squares appear contorted. In contrast, FIG. 1B, which is an image of the same object taken according to the invention, as more fully described below, is essentially free from aliasing effects. This is apparent from the equal light distribution along the fringes of the dark squares in the image. As a result, the squares appear undistorted.

In all beam scanning devices, where the beam is scanned either in a raster manner or in a bi-directional manner, the sampling is carried out in a different way in the different axes. Along the horizontal (fast) scanning axis, the pixel size is defined by determining a specific sampling time. Thus the pixel size in this axis is defined by the sampling time interval, multiplied by the beam linear speed. In the horizontal axis the actual spot size is smeared during the sampling time. A proper match of the sampling bandwidth, as known and easily carried out by the skilled person, usually compensates for proper sampling of the data. In the vertical axis, on the other hand, the pixel dimension is defined by the vertical distance that the beam travels from a given scanning line to the next one. When the pixel dimension in the vertical direction exceeds a proper ratio of the spot size in this direction, undersampling phenomena may occur (for object information that has high frequency components in the vertical direction).

There are two common ways to overcome aliasing effect. The first way involves generating an image with sufficient number of pixels at all fields of view, i.e., increasing the number of pixels in the vertical and horizontal direction. This method is discussed in detail in *"New Generation Scanning Electron Microscope Technology Based On The Concept Of Active Image Processing"*, [Esikahu Oho et al, Scanning Vol. 19 483–488, 1997]. This method, also called "active image processing", for removing the effects of aliasing errors, employs a procedure by which a large amount of data is acquired, and is then reduced by averaging into new pixel data. This procedure is efficient to remove aliasing errors, but presents other substantial drawbacks, inasmuch as when using this method one is required to generate larger and larger images the bigger the field of view is, which is a major disadvantage when further image processing is required.

The second method involves increasing the spot size to match it to the sampling pixel size. This can be done symmetrically or asymmetrically, by increasing the spot size in one direction more than in the other. This can be done very simply by defocusing the beam or by more complicated electron optics means. The major drawback of this method is that it either reduces the actual depth of focus of the system (in the first case), or involves a complicated control over the beam shape electron optics (in the second case). Moreover, it requires increasing spot size in a non-symmetrical way in the two axes.

It is therefore clear that the art has not yet provided a simple and efficient way to overcome the aforesaid drawbacks and to eliminate aliasing effects in scanning beam microscopy.

It has now been found that by increasing the number of pixels in the vertical direction, by generating a plurality of successive images of the same object, wherein each image is shifted in the vertical direction by a distance smaller than the distance between two lines, and then averaging all the images together, a substantial reduction of the aliasing effect can be obtained. This method, which is explained in more detail below, further has the advantage of providing an enhanced signal-to-noise ratio, which would not be obtained by using the above prior art methods of modifying the electron beam shape or defocusing. Furthermore, the method of the invention avoids enlarging the pixel number in both vertical and horizontal directions, which is necessary for the above-described method of Oho et al.

Therefore, the method of the present invention avoids expenses in terms of computer power and scanning ability and expenses in terms of beam shaping means associated with the various prior art methods, while at the same time, maintaining the focus and even reducing the signal-to noise ratio.

It is therefore an object of the present invention to provide a method for eliminating the undersampling effect in scanning beam microscopes, without the need to defocus the beam, or to generate large format images.

It is another object of the invention to provide apparatus for eliminating such undersampling effects.

Other objects of the invention will become apparent as the description proceeds.

SUMMARY OF THE INVENTION

The invention is primarily directed to a method for reducing aliasing effects in scanning beam microscopy, comprising generating a plurality of successive images of the same object, wherein each image is shifted in the vertical direction with respect to the preceding one by a sub-pixel distance, and then averaging all the images together. Since when operating according to the invention a larger amount of data is generated, a plurality of pixels is averaged to result in a single pixel.

By "sub-pixel distance" it is meant to indicate a distance that is a fraction of the vertical dimension of a pixel.

In one preferred embodiment of the invention the shift is calculated as a function of the Field of View and Number of Frames. In another preferred embodiment of the invention the process is carried out cyclically.

According to a preferred embodiment of the invention the scanning of the object is carried out in an interlaced manner, whereby scanning is effected at alternate lines and not sequentially on a line-by-line manner.

According to one preferred embodiment of the invention the whole object is sampled before the pixels are averaged. According to another preferred embodiment of the invention, one line, or a small number of consecutive lines, is scanned the required number of times, and is then averaged separately from the other lines.

The invention further encompasses an apparatus for reducing aliasing effects in a scanning beam imaging system, comprising a host, a digital scanner, scan amplifier, attenuator, and beam deflection system, said host being suitable to provide the scanner with sub-pixel shift instructions that are translated by the scanner in Y movements of the scanning beam, thereby to generate an image shifted by a subpixel, and wherein the host averages at least two sub-pixel shifted images.

In another aspect, the invention is directed to a scanner system suitable for use in the method of the invention, comprising a unit to generate subpixel shift instructions for a scan amplifier or beam deflector system.

DETAILED DESCRIPTION OF PREFERRED EMBODIMENTS

As explained above with reference to the Oho et al. article, a common way to increase the signal to noise ratio (SNR) in beam scanning microscopes is to generate more than one image of the same object and to average all the generated images. In this process all the random noise is reduced while the real object information is not effected and thus the SNR is improved. Modern scanning microscope systems use a recursive average formula for continuous scan (sometime referred to as "gliding average"), or fixed number of frame average.

The present invention provides a novel scanning method for frame averaging that reduces the aliasing effect, while improving the SNR of the generated image. This is achieved by generating a successive number of images of the same object, where each image after the first one, is shifted in the vertical direction by a sub-pixel distance, and then by averaging all the images so acquired together. It should be emphasized that this scanning mode does not reduce the resolution obtained in the standard raster scan mode.

Figure 2:
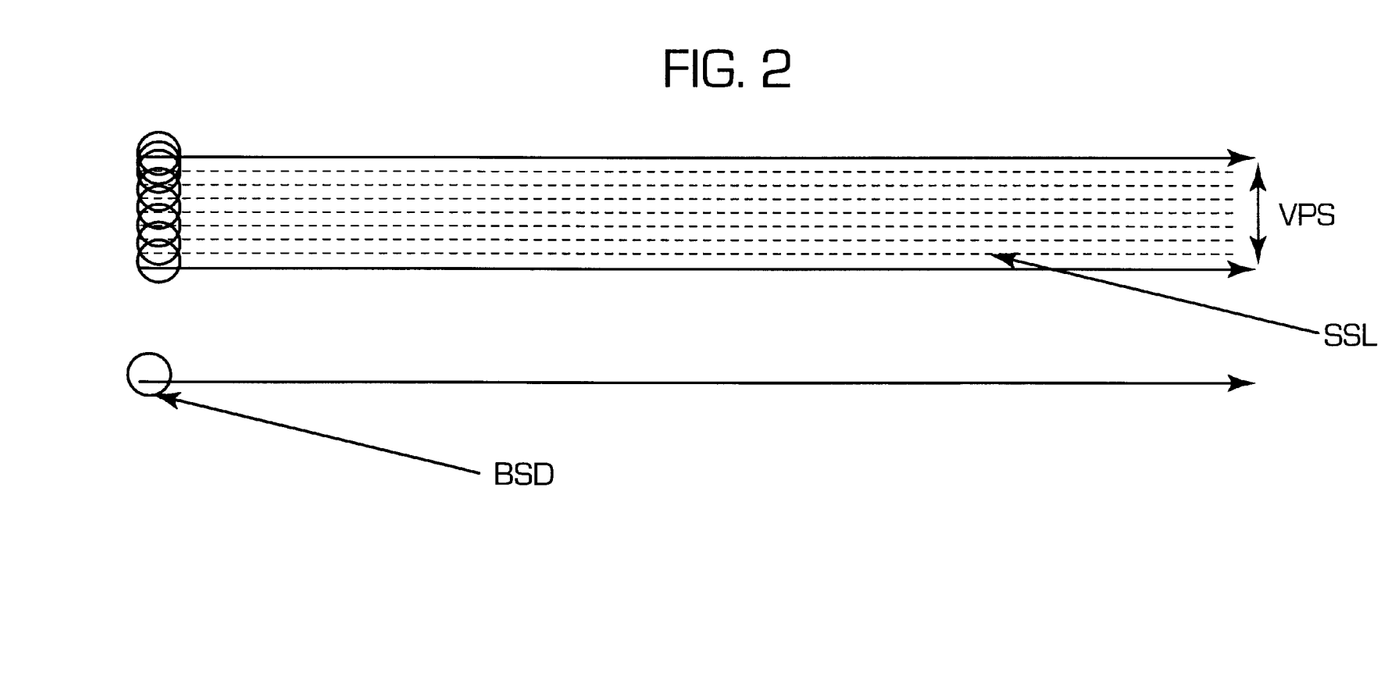
FIG. 2 is diagram illustrating the scanning process according to the invention.

FIG. 2 depicts the general approach of the invention. In FIG. 2, VPS is the vertical pixel size, SSL is the sub-pixel size, and BSD is the beam spot diameter. As shown in FIG. 2, the vertical pixel is broken down to sub-pixels, each having a width smaller than the spot size. Thus, the image is generated by scanning a successive number of images of the object, while each image has a different vertical shift. All the images can then be averaged together.

As stated above the vertical distance between two scanned lines must be smaller than the actual beam spot size, by a specific ratio. This is achieved, according to the present invention, by carrying out the sub-pixel shift of each averaged image, relative to the previous one. Since the resolution is limited in this case by the pixel size, any subpixel shift will not degrade the resolution. According to a preferred embodiment of the invention the required subpixel shift is computed separately for each field of view in order to optimize the image reconstruction of the object.

Several options are available for selecting the scan and display ordering. The simplest method would be to scan the lines successively in order from top to bottom, and display the obtained lines in real time. This, however, causes a flicker phenomena, since the sample is sampled differently in each scan. Such a flicker may irritate the operator. Thus, one solution is to blank the display until all the images have been acquired and averaged. Alternatively, the scanning order can be set to be random or semi random. By semi-random is meant that constraints are imposed on the random generation (e.g., no three successive lines in a row). It is the inventor's experience that using a random sub-pixel vertical shift avoids the flicker phenomena even if the images are displayed in real time.

For the purpose of illustration, two criteria for computing the subpixel shift will be exemplified:

Average Method

This method applies when the number of frames to be averaged is known before the scanning operation starts. There are two parameters involved in this calculation.

a. The required spot size over sampling ratio. We shall assume for demonstration purpose that two samples per spot are required in order to reconstruct all image information without a loss. The number of subpixel shifts that is required is therefore equal to the number of spots that are contained in the gap between two successive lines, times the sampling ratio.

$$\frac{\text{number of subpixel shifts}} = \frac{\text{vertical pixel size } (x2)}{\text{spot diameter}}$$

b. In case the number computed in (a) above is larger than the required number of frames to be averaged, one could compromise on the quality of sampling and let the number of subpixel shifts be equal to the number of required frames. The number of subpixel shift must in any case be an integer.

To summarize, the number of subpixel shifts is equal to the following:

$$\text{maximum (integer(2} \times \text{pixelsize/spot diameter), number of frames)}$$

and the actual vertical distance of the subpixel shift is given by $$\frac{\text{Vertical pixel size}}{\text{Number of subpixel shifts}}$$

To clarify the matter a numerical example is given. Let us assume the following:

Field of view (FOV) of 20 μm;

500×500 pixels in the image;

and spot diameter of 10 nm 32 frames to be averaged.

Thus the vertical pixel size is 20 μm/500=40 nm and 40 nm/10 nm=4, spot diameters are contained in the vertical gap. Assuming two samples per spot, 8 samples of subpixels are required. On the other hand, 32 frames are averaged and thus the number of subpixel shift that are allowed in this case is 32. The vertical subpixel shift will be 40 nm/32.

Gliding Average Method

When operating with continuous frame averaging, according to the invention, the subpixel shift is carried out in a cyclic manner. Once the accumulated vertical shift is equal to the vertical distance between the original scanned lines, the subpixel shift of the next image is set again to zero.

The size of the subpixel shift is determined by the following:

$$\frac{\text{number of subpixel shift in a cycle}}{} = \frac{\text{vertical pixel size} \times \text{sampling ratio}}{\text{spot diameter}}$$

and the vertical subpixel shift is given by $$\frac{\text{vertical pixel size}}{\text{number of subpixel shift in a cycle}}$$

Correcting the aliasing error with the above method during a continuous scan may induce a flicker in the screen due to the fact that the object is being sampled in a different way at each frame. In order to reduce the flicker it is required to create the subpixel vertical shifts in a random manner and not in a successive order.

EXAMPLE

Figure 1A:
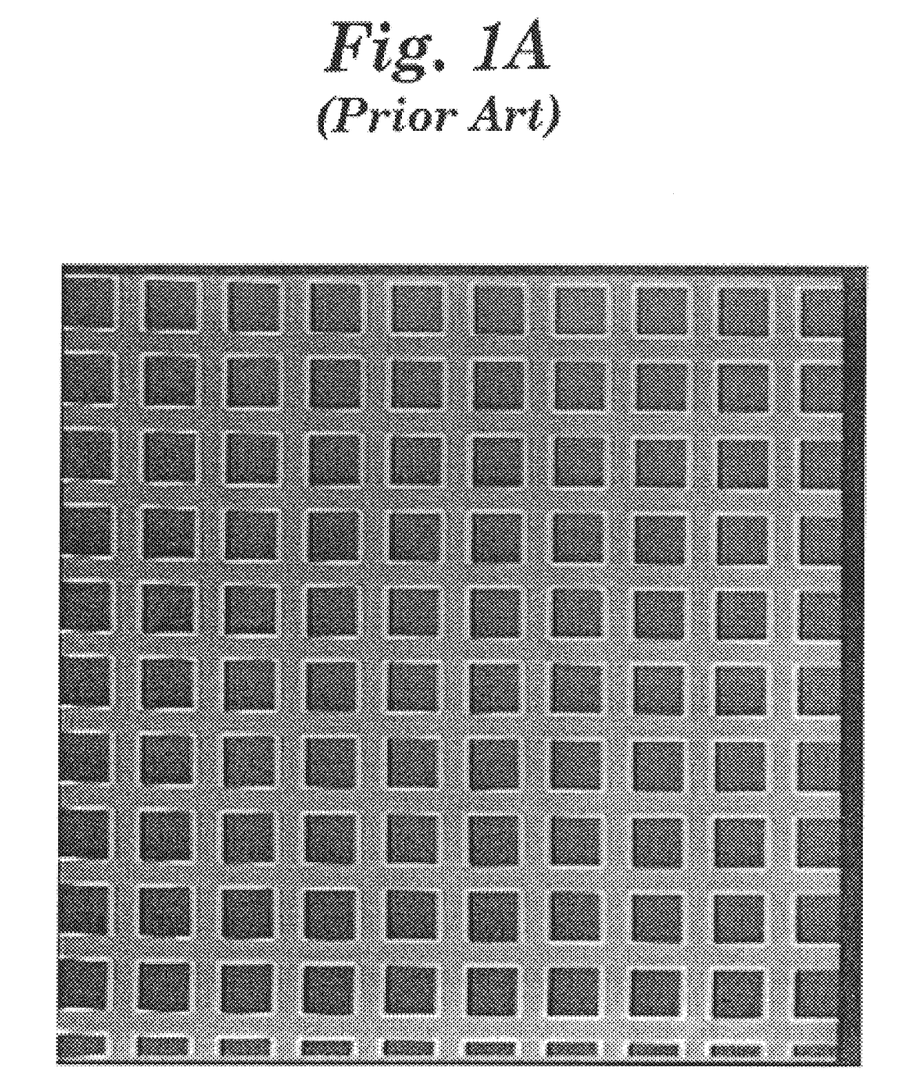
FIG. 1A is an image of a photoresist on a silicon wafer, taken with a GEMINI LEO, U.K. apparatus, equipped with a digital scanner. The image illustrates the aliasing errors which the invention seeks to prevent.

A photoresist on a silicon wafer was scanned using a GEMINI LEO, U.K. apparatus, equipped with a digital scanner. The digital scanner was an in-house developed scanner, but any suitable digital scanner can be used instead. This scanner was used in all cases. The image obtained without any anti-aliasing correction is shown in FIG. 1A, which exhibits marked aliasing errors. These are especially obvious at the fringes of the dark squares in the image, which are unequal in their intensity (Moire fringes). As a result, the squares appear contorted.

Figure 1B:
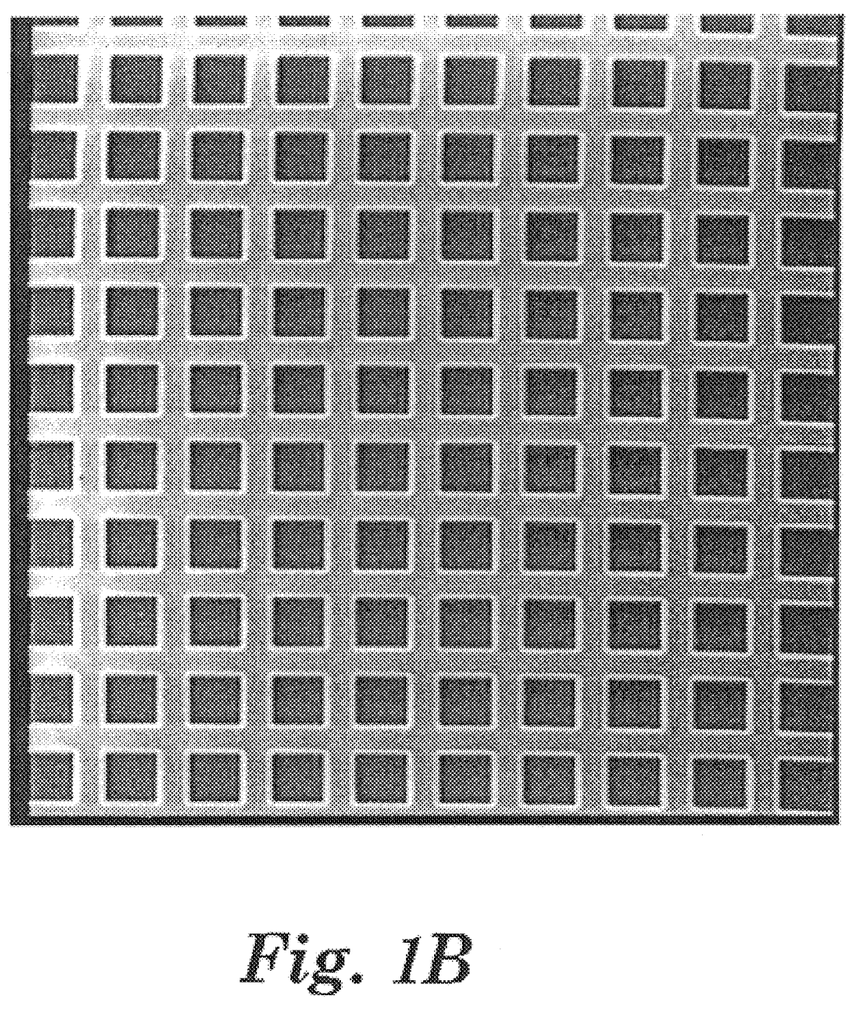
FIG. 1B is an image of the same photoresist of FIG. 1A, taken using the method of the invention.

The same specimen was scanned using the method of the invention as exemplified in FIG. 2. The resulting image, FIG. 1B, shows that the aliasing errors described above have been substantially corrected.

Figure 3A:
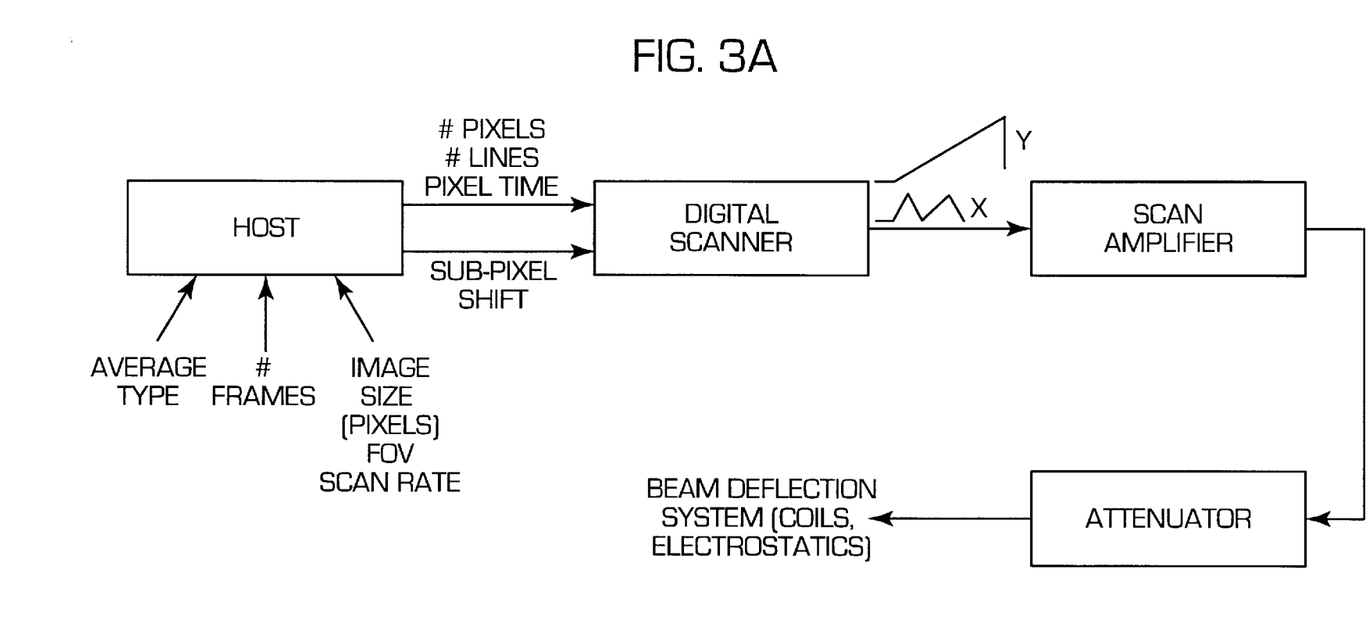
FIGS. 3A and 3B are block diagrams of a scanning and imaging arrangement according to one embodiment of the invention.
Figure 3B:
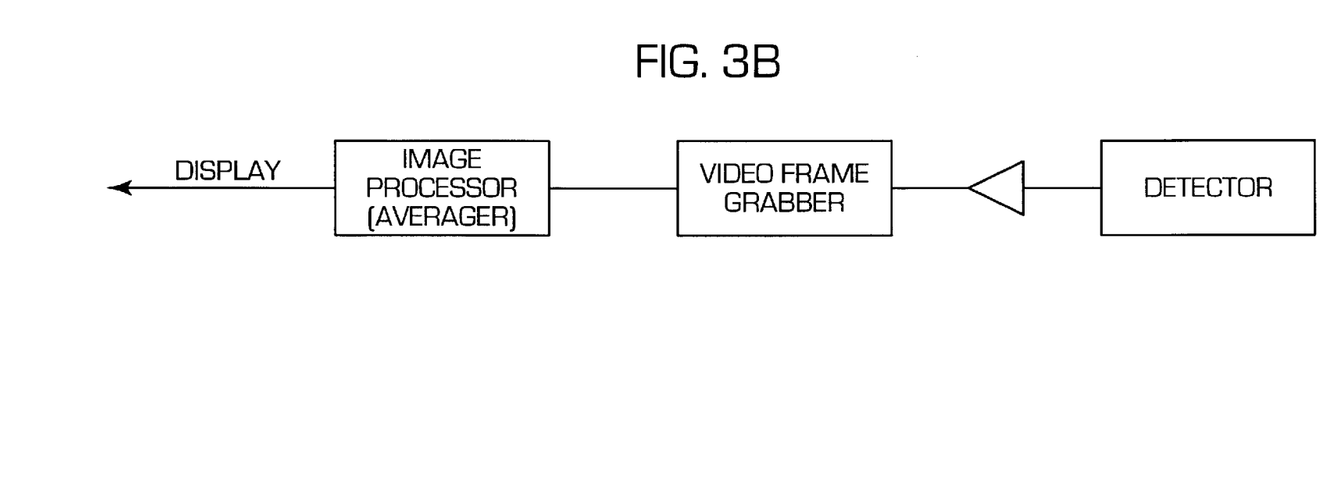

An imaging arrangement according to a preferred embodiment of the invention is schematically illustrated in block diagram form, in FIG. 3. FIG. 3A shows the operation of the system and its inputs, and FIG. 3B illustrates the steps after the image is detected at the detector. Looking now at FIG. 3A, a host, which is typically a PC or other computer, receives operating instructions, either directly from the operator, or in pre-programmed form. These instructions include, for example, the type of average employed, the number of frames desired, the image size in pixels, the FOV and scan rate. From this input the host generates appropriate values for the number of pixels, the number of lines, the pixel time and the sub-pixel shift. The generation method of these values will be apparent to the skilled person from the above description, and is therefore not discussed herein in detail, for the sake of brevity. The operating instructions generated by the host are fed to the digital scanner, which translates them in X and Y movements of the scanning beam (schematically shown in the figure), which are further handled by system elements such as the scan amplifier and the attenuator, which are known in the art and therefore not discussed herein in detail.

The image is generated by the stream of secondary or back-scattered electrons, which are detected by a detector, as schematically shown in FIG. 3B. These are translated into images in a manner known per se, and then, through a video frame grabber, are fed to an image processor which averages the pixels and sends the resulting image to display means and/or to printing means, to generate images such as those shown in FIG. 1.

Figure 4:
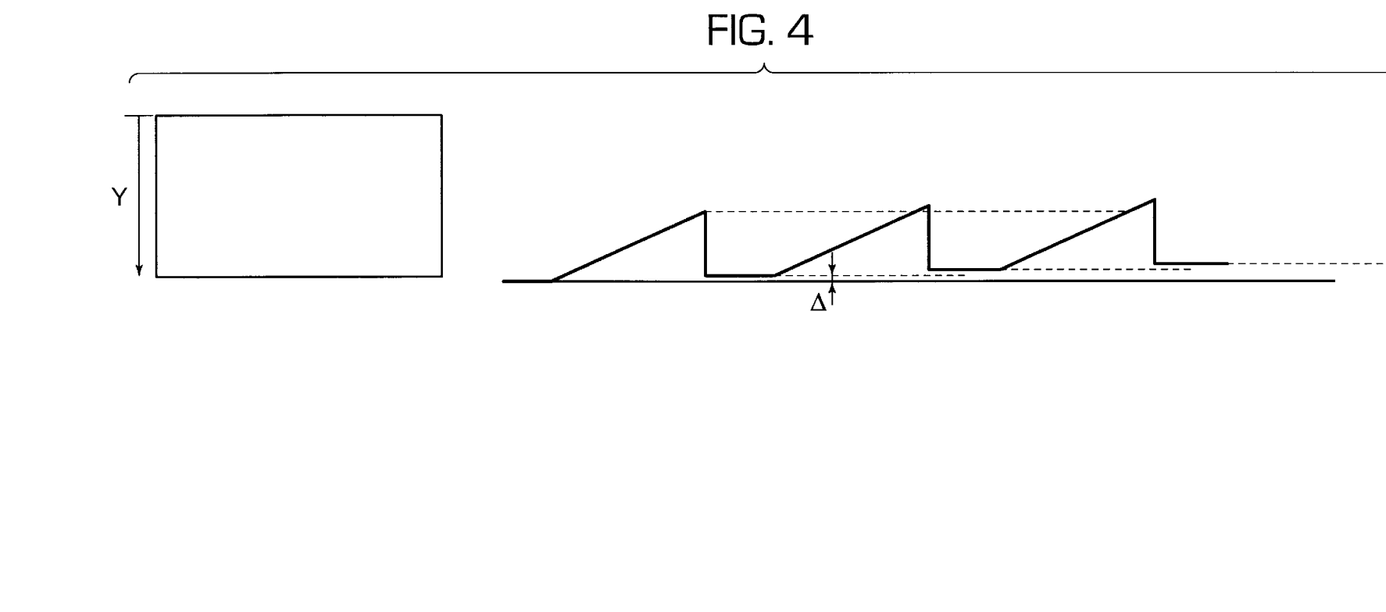
FIG. 4 illustrates the output of the digital scanner in the Y direction. The Greek letter delta denotes the subpixel shift.

FIG. 4 schematically illustrates the shift in the Y direction of the scanned signal with time. This results in progressive adjacent outputs, as shown in the figure. The line indicated as "VB" in the figure, is the well known Vertical Blank.

The above schematic description of a system has of course been provided only as an illustration, and, as will be apparent to the skilled person, the invention can be carried out using many different types of apparatus and assembly thereof, and is not limited to use with any particular system or arrangement.

For example, it should be apparent that the invention can be used with a rotated scan. By rotated scan is meant that the scan axes do not coincide with the beam deflector axes, a scanning method known per se. That is, generally the scan line in the x-direction is parallel to the virtual line connecting the x-scan deflectors, while the scan in the y-direction is parallel to the virtual line connecting the y-scan deflectors. In this way, the output of the scanner corresponds exactly to the axes defined by the physical deflectors. On the other hand, the scan in x-direction can be rotated, so that the axes of the image do not coincide with the actual axes of the deflectors.

While embodiments of the invention have been described by way of illustration, it will be understood that the invention can be carried out by persons skilled in the art with many modifications, variations and adaptations, without departing from its spirit or exceeding the scope of the claims.

What is claimed is:

1. A method for reducing aliasing effects in scanning beam microscopy, comprising generating a plurality of successive images of the same object, wherein each image is shifted in the vertical direction with respect to the preceding one by a sub-pixel distance and then averaging all the images together.

2. A method according to claim 1, wherein the shift is calculated as a function of the Field of View and Number of Frames.

3. A method according to claim 2, wherein the process is carried out cyclically.

4. A method according to claim 1, wherein the required subpixel shift is computed separately for each field of view in order to optimize the image reconstruction of the object.

5. A method according to claim 1, wherein the whole object is sampled before the pixels are averaged.

6. A method according to claim 1, wherein at least one line is scanned the required number of times, and is then averaged separately from the other lines.

7. A method according to claim 1, wherein the scanning of the object is carried out in an interlaced manner.

8. A method according to claim 7, wherein the scan can be rotated.

9. The method according to claim 1, wherein the scanning is carried out in a random order.

10. Apparatus for reducing aliasing effects in a scanning beam imaging system, comprising a unit for generating a plurality of successive images of the same object, wherein each image is shifted in the vertical direction with respect to the preceding one by a sub-pixel distance, and a unit for averaging all the images together.

11. Apparatus for reducing aliasing effects in a scanning beam imaging system, comprising a host, a digital scanner, scan amplifier, and beam deflection system, said host being programmed to provide the scanner with sub-pixel shift instructions that are translated by the scanner in Y movements of the scanning beam, thereby to generate an image shifted by a subpixel, and wherein the host averages at least two sub-pixel shifted images.

12. Apparatus according to claim 10 or 11, wherein the imaging system is a scanning beam microscope.

13. A recording medium having a computer program operable to direct a scanning signal generator to produce a scanning signal, the program having the steps comprising:
   obtaining a vertical pixel size;
   dividing the vertical pixel size to a plurality of sub-pixel scan lines; and
   generating scan signals corresponding to the sub-pixel scan lines.

14. The recording medium having a computer program of claim 13 wherein the signals corresponding to the sub-pixel scan lines are output in an interlaced manner.

15. The recording medium having a computer program of claim 13 wherein the signals corresponding to the sub-pixel scan lines are output in a random order.

16. The recording medium having a computer program of claim 13 wherein the number of sub-pixels lines is calculated as a function of the vertical pixel size and a diameter of a scanning beam directed by the scanning signal.

17. The recording medium having a computer program of claim 16, wherein the number of sub-pixel lines is further a function of the sampling cycle of the scanning beam.

* * * * *